United States Patent
Van der Vleuten

(10) Patent No.: US 7,171,053 B2
(45) Date of Patent: Jan. 30, 2007

(54) DEVICE AND METHOD FOR COMPRESSING A SIGNAL

(75) Inventor: Renatus Josephus Van der Vleuten, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 786 days.

(21) Appl. No.: 10/275,494

(22) PCT Filed: Mar. 4, 2002

(86) PCT No.: PCT/IB02/00620

§ 371 (c)(1),
(2), (4) Date: Nov. 5, 2002

(87) PCT Pub. No.: WO02/071622

PCT Pub. Date: Sep. 12, 2002

(65) Prior Publication Data

US 2003/0179938 A1    Sep. 25, 2003

(30) Foreign Application Priority Data

Mar. 5, 2001    (EP) .................................. 01200809
Nov. 14, 2001   (NL) .................................. 1019364

(51) Int. Cl.
*G06K 9/00*    (2006.01)

(52) U.S. Cl. ..................................... 382/244; 382/232
(58) Field of Classification Search ................ 382/232, 382/244–247, 237; 375/240; 386/109; 341/76
See application file for complete search history.

(56) References Cited

U.S. PATENT DOCUMENTS

| | | | |
|---|---|---|---|
| 5,884,005 A | 3/1999 | Peters | 386/109 |
| 6,028,541 A | 2/2000 | Levine | 341/76 |
| 6,269,338 B1* | 7/2001 | Bruekers et al. | 704/500 |
| 6,289,306 B1* | 9/2001 | Van Der Vleuten et al. | 341/76 |
| 2001/0003165 A1* | 6/2001 | Van Der Vleuten et al. | 700/90 |

FOREIGN PATENT DOCUMENTS

EP    1054514 A1    11/2000

* cited by examiner

Primary Examiner—Duy M. Dang

(57) ABSTRACT

A signal having units of two or more bits is compressed into a compressed signal by splitting a unit of two or more bits into an MSB part, which includes the most significant bit of the unit of two or more bits, and an LSB part which does not include the most significant bit of the unit of two or more bits. The MSB part is compressed in a lossless fashion. The LSB part is scalability compressed. The compressed MSB and LSB parts are combined to form the compressed signal.

18 Claims, 2 Drawing Sheets

DEVICE AND METHOD FOR COMPRESSING A SIGNAL

The invention relates to a device for compressing a signal comprising units of two or more bits into a compressed signal, which device comprises a first compressing device for lossless signal compression and a second compressing device for signal compression.

The invention also relates to a method for compressing a signal comprising units of two or more bits into a compressed signal.

High-performance and low-complexity lossless compression of a signal is possible in particular if the compressing scheme is specifically geared to the application in which the signal is present. Scalable compressing schemes, on the other hand, are flexible.

The lossless compression of a digital signal, such as music of video signals, results in a compressed signal having a variable, signal-dependent bit speed. In practice, however, a fixed bit speed or fixed compression ratio is often required. For high-quality applications, lossless compression is desired as much as possible.

If the desired compression ratio cannot be obtained by means of lossless compression, near-lossless compression is allowed.

Losslessly compressing an image produces a variable number of bits, depending on the image content. However, for certain applications a fixed maximum number of bits or a certain guaranteed compression ratio is required. For example, in case only a fixed limited storage space is available to store the compressed image, or only a fixed bandwidth is available to transmit it. Typically, this storage space or bandwidth is dimensioned based on the average lossless compression ratio (with a certain safety margin). If it were dimensioned on the worst case (i.e. when the image contains random data and cannot be losslessly compressed), it would not make sense to apply compression at all. For such applications, preferably lossless compression is used, but when lossless compression cannot achieve the required compression ratio, near-lossless compression is necessary.

Recently, compression schemes have become available that enable the bit stream to be simply truncated at a desired bit rate (or compression ratio). Such compression schemes are referred to as bit-rate scalable compression schemes. When using perfectly invertible "integer-to-integer" transforms, these compression schemes can offer fine-granularity scalability from lossless to near-lossless compression at the desired compression ratio.

Nevertheless, the known scalable schemes also have drawbacks, in particular if lossless or near-lossless compression is desired. One of those drawbacks is the fact that the known scalable schemes are not optimized for the performance of lossless compression. Furthermore, the known scalable compression methods have a high complexity compared to the dedicated lossless/near-lossless compression methods. For example, JPEG2000 requires 4.3 times as much CPU time as JPEG-LS to decompress a certain set of losslessly compressed images. Thus the known scalable compression methods are not ideal for lossless and near-lossless compression.

On the other hand, known dedicated lossless/near-lossless compression schemes, such as JPEG-LS, are not scalable: when the bit rate is too high, the signal has to be completely re-encoded at a lower bit rate (possibly multiple times), until the required compression ratio has been obtained. This significantly increases the complexity of using these schemes.

An example of a device and a method in which the aforesaid drawbacks manifest themselves can be found in U.S. Pat. No. 5,884,005. Said patent specification discloses a device for compressing a signal, which device comprises a first compressing device for lossless compression of a signal and a second compressing device for near-lossless compression of a signal. The two compressed signals are separately written to a medium.

It is an object of the invention to provide a compression scheme which combines the advantages of the low complexity and the high-performance of lossless compression of the dedicated lossless compression schemes and furthermore possesses the the feature of fine-granularity bit-rate scalability from lossless to near-lossless compression.

To this end, a device according to the invention is characterised in that the device comprises means for splitting, at a splitting position within a unit of two or more bits, the unit of two or more bits into an MSB part, which comprises the most significant bit of the unit of two or more bits, and an LSB part, which does not comprise the most significant bit of the unit of two or more bits in that the first compressing device is connected to a first output of the splitting means for lossless compression of the MSB part, in that the second compressing device is connected to a second output of the splitting means for compression of the LSB part, and in that the device comprises means, connected to an output of the first and the second compressing device, for combining the compressed MSB and LSB parts into the compressed signal.

The invention is based on the observation that the least significant part of the unit will be indiscriminate practically at all times, so that lossless compression thereof is hardly possible. Consequently, the performance loss for said least significant part, the LSB part, will be small in comparison with a lossless compressing device which is operative on an unsplit signal. On the other hand, it is possible to obtain the desired scalability. The scalability is limited, however, because the scalability of the LSB part can only be obtained by truncating that part. As a result, the invention is used to its best advantage when used with high-quality compression, that is, with lossless or near-lossless compression.

The invention is further based on the observation that the least significant bits of an image are typically approximately random, so they cannot be significantly compressed losslessly. Therefore, the performance loss compared to a lossless coder that operates on a non-split signal is small. In return, the desired scalability property is obtained.

A preferred embodiment of a device according to the invention is characterized in that the second compressing device is arranged for scalable compression of the LSB part.

As a result, the description of the signal can be truncated at any desired point, so that continuous scaling of the compression to the desired compression ratio is possible.

Preferably, the compression scheme according to the invention works on a frame basis, which means that several music or video samples are processed simultaneously as one unit. The manner in which a frame is split can be adaptively determined for each frame. In addition, a final processing step can be carried out in order to create a scalable description for multiple frames. For example, if an image is divided into frames, it is possible to create a scalable description for the entire image by putting the parts of all individual frames that have undergone lossless compression in the description first, followed by suitably combined scalable parts of the individual frames. The scalable parts may have been combined in such a manner that the description is created for the entire image which in turn consists of a lossless part and a scalable part. In doing so, a possibility of truncating the scalable part at any desired point is created; this is realized by causing the most important information to appear in the scalable part first.

A preferred embodiment of a device according to the invention is characterized in that a connection is present between the first and the second compressing device and in that information relating to the MSB part can be transferred to the second compressing device via said connection for the purpose of influencing the compression of the LSB part.

As a result, the compressing device can use information on the most significant part and/or the lossless compression thereof for the scalable compression operation in order to achieve a more efficient compression of the least significant part. This is possible because the information in question is not truncated. For example, the second compressing device may use, or need, the information for determining the perceptual relevance of the samples in the LSB part and for adapting the scalable compression thereto accordingly.

The invention will now be explained in more detail with reference to the accompanying drawing, in which.

Figure 1:
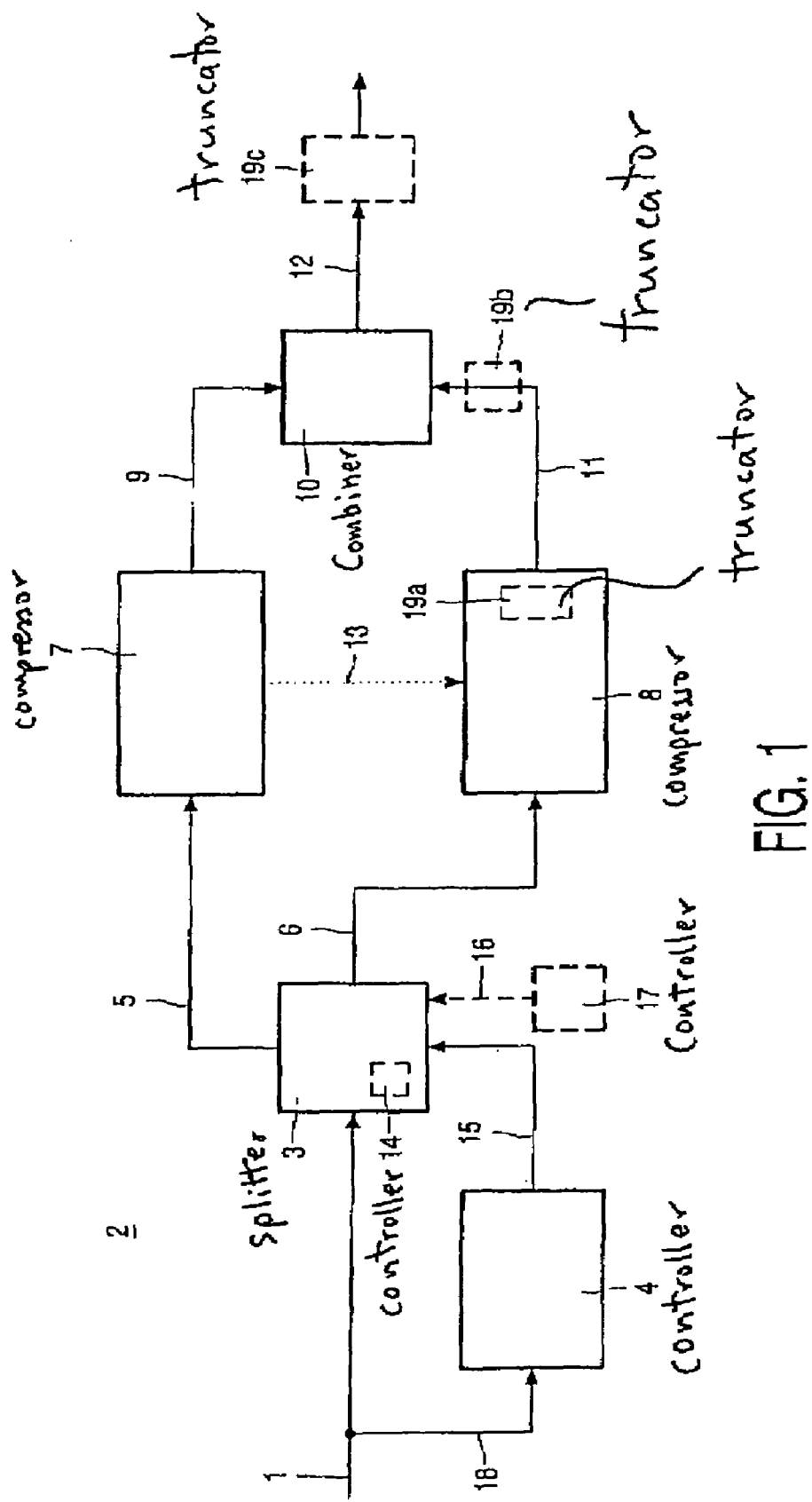
FIG. 1 shows an example of the device according to the invention.

In FIG. 1, the reference numeral 1 schematically indicates a line via which a signal to be compressed, which comprises units of two or more bits, is fed to a device 2 for compression of the signal. Line 1 is connected to a signal input of the splitting module 3. Line 1 is furthermore connected to a signal input of a control unit 4 via a line 18. The splitting module 3 has a first output line 5 and a second output line 6. Output line 5 is connected to an input of a first compressing device 7 for lossless compression of a signal on line 5. Line 6 is connected to an input of a second compressing device 8. The second compressing device 8 is arranged for non-lossless compression of a signal that enters on line 6. An output line 9 of the first compressing device 7 is connected to a first input of a combining unit 10. An output line 11 of the second compression unit is connected to a second input of the combining unit 10. A combined signal composed of signals on the lines 9 and 11 is present on output line 12 of the combining unit 10. First compressing device 7 is connected to the second compressing device 8 via an information transfer line 13.

The core of the device 2 is formed by the splitting module 3, the first compressing device 7, the second compressing device 8 and the combining unit 10. The operation of the core unit is as follows. Splitting module 3 receives a signal comprising units of two or more bits via line 1. The signal is split by the splitting module 3, in a manner which is known per se, into an MSB part, which comprises the most significant bit of the unit of two or more bits of the signal, and an LSB part, which does not comprise said most significant bit. The MSB part appears on line 5 and the LSB part appears on line 6. The compressing device 7 compresses the LSB part without loss into a compressed MSB part on line 9. Likewise, the second compressing device 8 compresses the LSB part on line 6 into a compressed LSB part on line 11. The compressed MSB part and the compressed LSB part are combined into a compressed signal in the combining circuit, for example, by linking the compressed LSB part directly to the compressed MSB part.

A unit of two or more bits can be split by the splitting module 3 at one or more positions. The position at which said splitting takes place can be determined in various ways. The splitting module 3 may be permanently arranged for splitting a unit of two or more bits, entering via line 1 at, a predetermined position as is indicated by a control signal unit 14 which forms part of the splitting module 3. According to another possibility, the control signal unit may be arranged externally of the splitting module 3 as is indicated by a line 15 or a line 16. The line 16 forms the connection between a control input of the splitting module 3 and control signal unit 17. Control signal unit 17 generates a control signal which is independent of the signal on the line 1. The control signal generator 4, on the other hand, generates a control signal on line 15 which is dependent on the composition of the signal on line 1 that is to be compressed. Any one of the three possibilities, or a combination thereof, can be selected. In particular control signal unit 14 or control signal unit 4 may be so arranged that the splitting position is determined adaptively within a unit of two or more bits.

A digital input signal on line 1 which comprises units of two or more bits and is fed both to splitting module 3 and to control signal unit 4 is analyzed by the control signal unit 4 and split into two parts, that is, a most significant part and a least significant part, hereinafter also referred to as an MSB part and an LSB part, on the basis of the control signal that is delivered to splitting module 3 by the control signal unit 4 on line 15. The splitting of an input signal x could be effected when $x_m = x$ div $k$ for the MSB part and $x^1 = x$ mod $k$ for the LSB part. The setting $K = 2^m$ (wherein $m = 1, 2, \ldots$) is of great practical importance, because it corresponds to the splitting of the m least significant bits from the signal x.

The device according to FIG. 1 functions as follows. The block diagram of our compression method is shown in FIG. 1. The (digital) input signal is analyzed and split into two parts: a most significant part and a least significant part. The split of the input signal x can be described mathematically as $x_m = x$ div $k$ for the most significant part and $x_1 = x$ mod $k$ for the least significant part. The setting of $k = 2^m$ (with m is an integer for which holds 0; 1; 2; : : : ) is of particular practical importance, since it corresponds to just splitting off the m LSBs from the signal x. The most significant part is then losslessly compressed by a dedicated lossless compression method, such as JPEG-LS. The least significant part is compressed by a scalable encoder, i.e. in such a way that its description may be truncated at any desired point. A practical way of implementing the scalable encoder is to just rearrange the bit planes, without actually doing compression. This means that the scalable encoder first puts all the most significant bits (of the least significant part) in the stream, followed by the respectively less significant bits. Finally, the losslessly and scalably encoded parts are joined/concatenated. Information about the way the signal was split and/or about the sizes of the losslessly and scalably compressed parts can also be added, when necessary. The truncation of the compressed scalable data, in order to obtain a fixed compression ratio, can be performed during the joining operation, or at a later stage in the system.

It should be remarked, however, that the scalability is limited, since it can only be obtained from the least significant part (by truncating it). The dashed line between the lossless and scalable encoders indicates that the scalable encoder may use information about the most significant part and/or its lossless compression for more efficiently compressing the least significant part. This is possible because the scalable decoder will also be able to use this information (since it is never truncated). For example, the scalable encoder could use the information to determine the perceptual relevance of the data in the least significant part and adjust the scalable compression accordingly.

A practically relevant method of implementing the second compressing device 8, in which the second compressing device compresses a signal on the input thereof in a scalable manner, is to rearrange the bit planes without actually compressing. Since the least significant bits are concerned, not much benefit would be gained by compression, because there is not much redundancy in these bits. The rearrangement of the bit planes implies that the second, scalable compressing device 8 causes the most significant bits of the LSB parts in the bit stream being supplied on line 6 to appear on line 11 first, followed by the bits which are one step less significant each time. An example will make this clear. Suppose that the LSB part of three successive units y, u and v of two or more bits consists of three, two and two bits, respectively, to be denoted as $y_3, y_2, y_1, u_2, u_2, v_2, v_1$. In that case the second compressing device effects a rearrangement that finally leads to the following arrangement: $y_3, y_2, u_2, v_2, y_1, u_1, v_1$ on line 11. In order to be able to scale the bit speed, the combined description, $y_3, \ldots, u_1$, is simply truncated at the desired number of bits. It is to be noted that the rearrangement described herein is merely an example and that other examples of rearrangement are possible.

In FIG. 1, reference numerals 19a, 19b and 19c indicate three positions in the signal chain of the LSB part at which truncation can take place. The truncating means 19a form part of the second compressing device 8. As a result, the second compressing device 8 is in fact a non-lossless compressing device.

In the case that the truncating means 19b are incorporated in the line 11 between an output of the second compressing device 8 and the combining means 10, the second compressing device 8 can either be a lossless compressing device or a non-lossless compressing device.

It is also possible to arrange the truncating means 19c subsequent to the combining means 10 in the line 12. Similarly to the preceding case, the second compressing device 8 can be a lossless compressing device or a non-the lossless compressing device in that case. The truncating means 19c must furthermore be adjusted so that truncation only takes place on the part of the combined signal that originates from the second compressing device 8 and not on the part that originates from the first compressing device 7.

To evaluate the performance of the proposed method, we have performed compression experiments with JPEG-LS, using the implementation provided by the University of British Columbia. We evaluated the lossless and lossy performance of both JPEG-LS and the new method using JPEG-LS as the lossless compression method for the most significant bits and leaving the least significant bits uncompressed. The images used in our experiments are all 24 images (luminance component only) of the Kodak PhotoCD PCD0992 at a resolution of 512×768 pixels. Table 1 shows the compression efficiency and scalability range for various choices of the MSB/LSB split points. When no LSBs are split off, the scheme becomes a usual lossless compression method, without scalability. As more LSB planes are made scalable, the range of scalability increases. Also, the compression efficiency is reduced, but the bit rate increase is only 4% when 2 bit planes are split off.

TABLE 1

Compression efficiency and fine granularity scalability range for several MSB/LSB split points.

| LSB bit planes | MSB bit rate [bpp] | LSB bit rate [bpp] | total bit rate [bpp] | total bit rate [%] | Compression ratio range |
| --- | --- | --- | --- | --- | --- |
| 0 | 4.345 | 0 | 4.345 | 100 | 1.84–1.84 |
| 1 | 3.393 | 1 | 4.393 | 101 | 1.82–2.36 |
| 2 | 2.534 | 2 | 4.534 | 104 | 1.76–3.16 |
| 3 | 1.811 | 3 | 4.811 | 111 | 1.66–4.42 |
| 4 | 1.250 | 4 | 5.250 | 121 | 1.52–6.40 |

Figure 2:
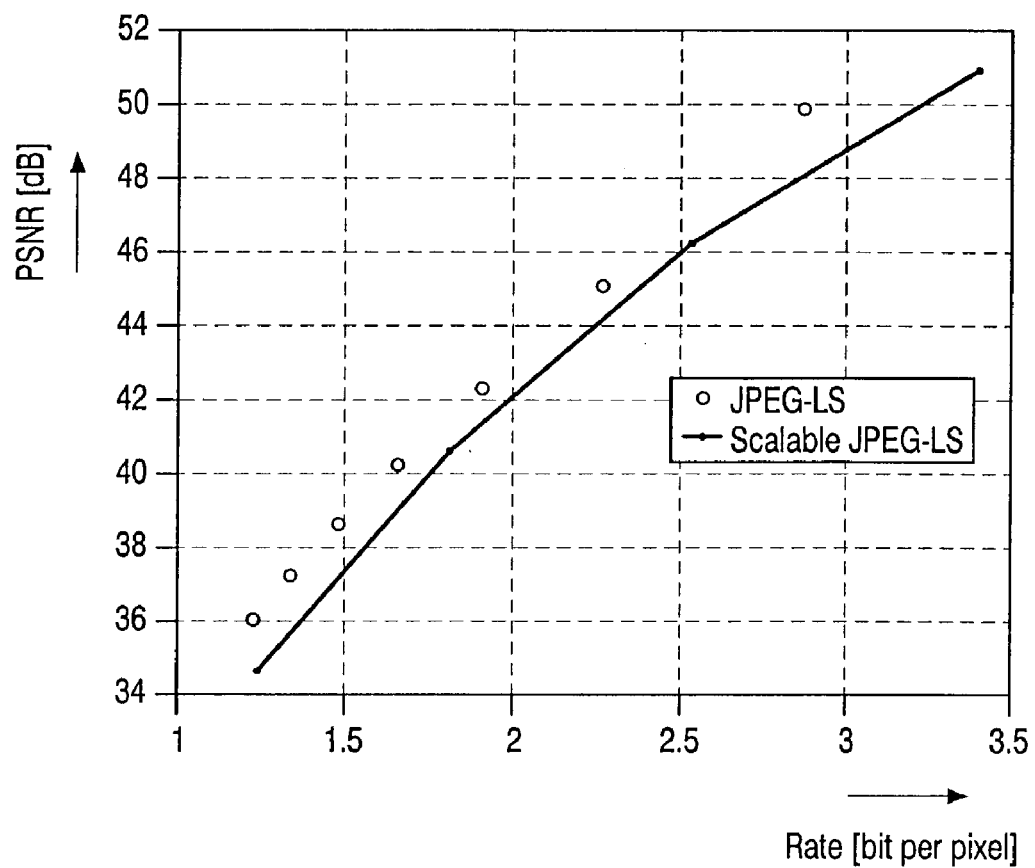
FIG. 2 shows near-lossless compression performance of JPEG-LS and the method according to the invention using JPEG-LS lossless compression.

The near-lossless compression performance of the scalable JPEG-LS based scheme can also be compared to that of the non-scalable near-lossless JPEG-LS compression, as shown in FIG. 2. For JPEG-LS, the points correspond to compressing using different maximum allowed absolute errors between the original and reconstructed images (ranging from 1 to 7 in FIG. 2). For the scalable method, the points in the curve were obtained by truncating all LSBs and thus keeping only the lossless MSB part (the bit rates for these points are listed in Table 1). The decoder substitutes the missing LSBs by their expected value, assuming a uniform random distribution of the LSBs. For example, when 2 LSB planes are removed, the expected value for the LSB part is $(0+1+2+3)/4=1.5$, which is implemented by randomly setting the LSB part to 1 for half of the pixels and to 2 for the other half. FIG. 2 shows that, as is the case for many scalable compression methods, there is an efficiency loss compared to the discrete points provided by the non-scalable method. However, one should keep in mind that the quality in the non-scalable case immediately drops to the next lower point in case the available bit rate or storage capacity is insufficient. For example, as shown in FIG. 2, JPEG-LS provides a PSNR of 49.96 dB at 2.866 bit per pixel. As soon as fewer bits are available, the PSNR for JPEG-LS will drop to 45.23 dB, corresponding to the next available compression setting at a rate of 2.267 bit per pixel. Consequently, for rates between approximately 2.4 and 2.866 bit per pixel, the scalable method has a higher PSNR.

In addition to the PSNR, also the visual quality of the reconstructed images has been evaluated. The visual inspection shows that compression artifacts are visible already for some images (the images with "blue skies") when only 2 LSB planes are removed or, for JPEG-LS, when a maximum absolute error of 2 is allowed. In this case, although the PSNR values for the two cases are approximately the same, the artifacts for the proposed method are more acceptable because they are more noise-like than the "striping" artifacts produced by JPEG-LS. However, for removing 3 LSB planes, compared to a maximum allowed absolute error of 4 for JPEG-LS, where again the PSNR values are approximately the same, the proposed method produces "contouring" artifacts that are visually more disturbing than the striping artifacts of JPEG-LS.

In the experiments described above, the MSB/LSB split point was set manually and was the same for each image as well as constant across the whole image. There are several advantages, however, associated with automatically and adaptively determining the split point. In general the "flatter" image parts, such as the blue skies, are much more sensitive to compression artifacts than other image parts. These same image parts also suffer the most loss of compression efficiency when their LSBs are split off. Therefore, a method for automatically selecting the number of LSB planes to split off for each line of each image will be disclosed. This method is based on the low-complexity lossless image compression method described previously.

Our lossless compression method follows the well-known DPCM+VLC setup: it consists of a reversible prediction step to decorrelate the data, followed by an entropy coding step to compress the prediction error signal. However, to obtain a very low complexity, for both the DPCM and VLC parts we choose a very low complexity solution. For prediction, the well-known "Paeth" predictor is used. This predictor uses only the three pixels to the left, upper-left and above the pixel to be predicted and selects the value of one of these pixels as a prediction of the value of the current pixel. The Paeth predictor is one of the prediction filter types used by the well-known PNG lossless image compression method.

The prediction error signal after Paeth prediction is then converted to a signed magnitude representation and losslessly encoded using a modified "Rice" code, which is disclosed in A. A. M. L. Bruekers, A. W. J. Oomen, R. J. van der Vleuten, and L. M. van de Kerkhof, "Lossless coding for DVD audio," in 101*st AES Convention*, (Los Angeles, Calif.), Nov. 8–11, 1996. Preprint 4358, an adaptive entropy code with a very low complexity. This entropy code first removes the m LSBs of the magnitude of a sample. The remaining MSBs are encoded using a unary code, i.e. the codeword for an MSB value of k consists of k 0-bits followed by a 1-bit (e.g. the codeword for k=3 is 0001). The m LSBs are then appended to the MSB codeword, as is the sign bit for non-zero magnitudes. For example, the prediction error value 15 for m=3 is translated into the codeword 011110, consisting of the code 01 for k=15 div 8=1, the m LSBs 111, and the sign bit 0. The parameter m is optimally chosen (i.e. such that it results in the lowest number of bits required for losslessly encoding the prediction error signal) as m=floor(log2(mean(abs(e)))), where e is the prediction error signal. In our implementation, the value for m is chosen once per image line, but it could also be updated more frequently.

In Table 2, the compression efficiency of our very low complexity method is compared to that of JPEG-LS, PNG, and JPEG2000. Despite its very low complexity, our method requires only 9% more bits than JPEG-LS to compress the 24-image test set (the same as used in Section 2.2). The difference with PNG, which also uses very low complexity prediction filters, but a complex entropy coding method, is quite small. For JPEG2000, we used the implementation provided by the University of New South Wales. According to this experiment, JPEG2000 is almost as efficient as JPEG-LS.

TABLE 2

Lossless compression bit rates (both absolute and relative) for the very low complexity method (New) compared to several other lossless compression methods.

|  | New | JPEG-LS | PNG | JPEG 2000 |
| --- | --- | --- | --- | --- |
| bits/pixel | 4.826 | 4.345 | 4.714 | 4.462 |
| % | 109 | 100 | 106 | 101 |

As was already explained previously, we would like to automatically determine the MSB/LSB split point for the scalable near-lossless compression method. This is performed in the "Analyze" block 4 in FIG. 1. The analysis proposed here is based on the very low complexity lossless image compression method described previously.

To determine the split point, first the Paeth prediction is carried out and the prediction error signal e is obtained. Next, the parameter m is again determined as m=floor(log2 (mean(abs(e)))). The parameter m now directly provides the splitting point: m LSBs are sent to the scalable encoder and the remaining MSBs are sent to the lossless encoder. This selection of the split point is based on the observation that the entropy code that is applied in the proposed very low complexity lossless image compression method described previously would not apply any compression on these bits (since they are simply copied directly into the codeword). Hence these LSBs are assumed to be more or less random and there is thus no loss of compression efficiency when they are not used for prediction in the lossless coding of the MSBs. This assumption has been confirmed experimentally. For example, when a fixed choice has to be made for m for all the image lines for all 24 test images, the value of m=2 would be chosen. This value results in a compression efficiency loss of only 4%, as shown in Table 1.

Sofar, we have only treated the compression of luminance or gray-value images. Most images, however, are color images. These images are often specified in the RGB color space, but it is well-known that this color space it not optimal for lossless compression, because of the correlation between the components. A higher lossless compression ratio can be obtained by transforming the image to a suitable different color space before compression. Since the overall method must remain lossless, the color transform has to be perfectly reversible. Color transforms with this property are also called lossless color transforms. Although many different lossless color transforms have been proposed in the compression literature, none of the existing lossless color transforms are designed for near-lossless compression. In order to be able to use perceptually relevant error criteria for near-lossless compression, we find to be suitable a lossless RGB to YUV transform, so all the perceptual error criteria developed for the YUV color space (which is commonly used for non-lossless image compression) can be applied to near-lossless compression as well.

The regular RGB to YUV transform is given by:

$$Y = 0.587 \cdot G + 0.299 \cdot R + 0.114 \cdot B \quad (1)$$

$$U = B - Y \quad (2)$$

$$V = R - Y \quad (3)$$

By applying the principle of invertible networks, as disclosed in "F. A. M. L. Bruekers and A. W. M. van den Enden, "New networks for perfect inversion and perfect reconstruction," *IEEE J. Select. Areas Commun.*, vol. 10, pp. 130–137, January 1992", this transform can be made perfectly reversible. The resulting new lossless RGB to LYUV transform (where we use LYUV to distinguish it from the non-lossless YUV) is given by:

$$Y_L = G + [0.299/0.587 \cdot R + 0.114/0.587 \cdot B] \quad (4)$$

$$U_L = B - [0.587 \cdot Y_L] \quad (5)$$

$$V_L = R - [0.587 \cdot Y_L] \quad (6)$$

where [·] indicates rounding to the nearest integer. The perfect inversion goes as $$B = U_L + [0.587 \cdot Y_L] \quad (7)$$

$$R = V_L + [0.587 \cdot Y_L] \quad (8)$$

$$G = Y_L - [0.299/0.587 \cdot R + 0.114/0.587 \cdot B] \quad (9)$$

Thus, $U_L$ and $V_L$ are the same as U and V for the regular RGB to YUV transform, whereas $Y_L$ has been increased in magnitude by a factor of 1/0.587 compared to Y in order to make the transform perfectly reversible.

In Table 3, the bit rates for compressing the same 24 RGB color images as used before are listed for various lossless color transforms (the absolute bit rates are given per sample; they should be multiplied by 3 to obtain bits per pixel). We compared our new transform with the well-known "NFJ" transform, the "CREW" transform, the "SHIRCT transform, the RDCT transform, and the "LOCO-I" transform.

From Table 3 the benefits of applying a color transform are clear, since directly compressing the RGB components requires 35% more bits than first transforming the image to the best alternative color space. Furthermore, the LYUV, LOCO-I, and CREW transforms outperform the other transforms. Quite remarkably, considering the various available different color transforms, the "simplest" transform (LOCO-I) turns out to be the best for lossless compression. The performance of the new LYUV transform is very close to that of the best transform for lossless compression. For near-lossless compression the LYUV transform is preferred since it provides the YUV color space that is commonly used for lossy compression.

TABLE 3

JPEG-LS lossless compression bit rates (both absolute and relative) for various lossless color transforms.

|  | RGB | LYUV | LOCO-I | NFJ | CREW | SHIRCT | RDCT |
|---|---|---|---|---|---|---|---|
| bits/sample | 4.353 | 3.315 | 3.235 | 3.391 | 3.262 | 3.518 | 3.446 |
| % | 135 | 102 | 100 | 105 | 101 | 109 | 107 |

We have presented a method that extends lossless compression with the feature of fine-granularity scalable near-lossless compression while preserving the high compression efficiency and low complexity of dedicated lossless compression methods. The method operates by splitting the signal into MSBs and LSBs. The MSBs are losslessly compressed, while the LSBs provide a scalable bit string. We also presented a method to automatically and adaptively determine the MSB/LSB split point such that a scalable bit string is obtained without affecting the compression efficiency and without producing compression artefacts for near-lossless compression. The splitting method was derived from a very low complexity lossless image compression method. Despite its simplicity, this compression method is quite efficient. Finally, we presented the LYUV transform, a new lossless color transform that is the lossless equivalent of the YUV transform that is commonly used for lossy image compression and has a performance for lossless compression that is very close to that of the best lossless color transform.

All kinds of embodiments and modifications will be apparent to a person skilled in the art after having studied the foregoing. All such modifications and embodiments are considered to form part of the invention.

The invention claimed is:

1. A device for compressing an input signal comprising units having a plurality of bits into a compressed signal, the device comprising:

splitting means for splitting each respective unit of the units having the plurality of bits into a respective MSB part, which comprises most significant bits of the respective unit and a respective LSB part, which does not comprise the most significant bits of the respective unit;

compressing means for compressing the respective MSB part to form a compressed MSB part;

a rearrangor configured to rearrange bits of an LSB unit including the respective LSB part of the units to from a rearranged LSB part, the rearranged LSB part being arranged from most significant bits of the LSB unit to least significant bits of the LSB Unit; and combining means for combining the compressed MSB part and the rearranged LSB part into the compressed signal.

2. The device as claimed in claim 1, further comprising truncating means for truncating the rearranged LSB part.

3. The device as claimed in claim 2, wherein the truncating means form part of the rearrangor.

4. The device as claimed in claim 2, wherein the truncating means are arranged between the rearrangor and the combining means.

5. The device as claimed in claim 2, wherein the rearrangor is configured for lossless compression of the LSB part.

6. The device as claimed in claim 2, wherein the rearrangor is configured for non-lossless compression of the LSB part.

7. The device as claimed in claim 1, wherein the rearrangor is configured for scalable compression of the respective LSB part.

8. The device as claimed in claim 1, further comprising control means having an output which is connected to a control input of the splitting means for determining a splitting position within the respective unit.

9. The device as claimed in claim 8, further comprising means for applying the input signal to the control means.

10. The device as claimed in claim 9, wherein the control means are arranged for delivering a control signal to the output, wherein the control signal is based on composition of the respective.

11. The device as claimed in claim 1, further comprising a connection between the compressing mean and the rearrangor, wherein information with regard to the respective MSB part is transferable to the rearrangor via said connection for influencing rearranging of the LSB unit.

12. A device for compressing an input signal comprising units having a plurality of bits into a compressed signal, the device comprising:

splitting mean for splitting, at a splitting position, each respective unit of the units of the plurality of bits into a respective MSB part which comprises most significant bits of the respective unit, and a respective LSB part which does not comprise the most significant bits of the respective unit;

first compressing means for compressing the respective MSB part to form a compressed MSB part;

second compressing means for compressing the respective LSB part to from a compressed LSB part;

combining means for combining the compressed MSB part and the compressed LSB part into the compressed signal; and control means for adaptive determination of the splitting position.

13. A device for comprising an input signal comprising units having a plurality of bits into a compressed signal, the device comprising:

splitting means for splitting each respective unit of the units of the of bits into a respective MSB part which comprises most significant bits of the respective unit, and a respective LSB part which does not comprise the most significant bite of the respective unit;

firs compressing means for compressing the respective MSB part to form a compressed MSB part;

second compressing means for compressing the respective LSB part to form a compressed LSB part;

combining means for compressed the compressed MSB part and the compressed LSB part into the compressed signals; and truncating means for truncating the compressed LSB part, wherein the truncating means are arranged subsequent to the combining means.

14. A method for compressing a signal comprising units of two or more bits into a compressed signal, the method comprising the acts of:

splitting each of the units into a respective MSB part, which comprises most significant bit of a respective unit of the units, and a respective LSB part, which does not comprise the most significant bit of the respective unit, compressing the respective MSB part to form a compressed MSB part, rearranging bits of an LSB unit including the respective LSB part of the units to form a rearranged LSB part, the rearranged LSB part being arranged from most significant bits of the LSB unit to least significant bits of the LSB unit, and combining the compressed MSB part and the rearranged LSB part into the compressed signal.

15. The method as claimed in claim 14, wherein the rearranged LSB part is truncated.

16. The method as claimed in claim 14, wherein a splitting position at which the splitting in the respective unit is performed depends on the composition of the respective unit.

17. A method for compressing an input signal comprising units having a plurality of bits into a compressed signal, the method comprising the acts of:

splitting each respective unit of the units of the plurality of bits into a respective MSB part which comprises most significant bits of the respective unit, and a respective LSB part which does not comprise the most significant bits of the respective unit;

compressing the respective MSB part to form a compressed MSB part;

compressing the respective LSB part to form a compressed LSB part;

combining the compressed MSB part and the compressed LSB part into the compressed signal; and truncating the compressed LSB part subsequent to the combining act.

18. A method for compressing an input signal comprising units having a plurality of bits into a compressed signal, the method comprising the acts of:

splitting, at a splitting position, each respective unit of the units of the plurality of bits into a respective MSB part which comprises most significant bits of the respective unite and a respective LSB part which does not comprise the most significant bits of the respective unit;

compressing the respective MSB part to form a compressed MSB part;

compressing the respective LSB part to form a compressed LSB part;

combining the compressed MSB part and the compressed LSB part into the compressed signal; and adaptively determining the splitting position.

* * * * *